United States Patent
Pougeoise et al.

(10) Patent No.: US 9,245,948 B2
(45) Date of Patent: Jan. 26, 2016

(54) OPTOELECTRIC DEVICE WITH SEMICONDUCTOR MICROWIRES OR NANOWIRES AND METHOD FOR MANUFACTURING THE SAME

(71) Applicants: ALEDIA, Grenoble (FR);
Commissariat à l'Energie Atomique et aux Energies Alternatives, Paris (FR)

(72) Inventors: Emilie Pougeoise, Grenoble (FR);
Amelie Dussaigne, Bizonnes (FR)

(73) Assignees: ALEDIA, Grenoble (FR);
COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 37 days.

(21) Appl. No.: 14/082,943

(22) Filed: Nov. 18, 2013

(65) Prior Publication Data

US 2014/0077151 A1    Mar. 20, 2014

Related U.S. Application Data

(63) Continuation of application No. PCT/FR2013/052128, filed on Sep. 17, 2013.

(51) Int. Cl.
*H01L 29/06* (2006.01)
*H01L 21/02* (2006.01)
(Continued)

(52) U.S. Cl.
CPC ........ *H01L 29/0657* (2013.01); *H01L 21/0254* (2013.01); *H01L 21/0259* (2013.01);
(Continued)

(58) Field of Classification Search
CPC ............... H01L 21/0254; H01L 21/02617; H01L 21/02458; H01L 31/035227; H01L 33/007; H01L 33/18; H01L 21/02381; H01L 21/02439; H01L 21/0262; H01L 29/0657; H01L 21/02387; H01L 29/0673; H01L 29/068; H01L 29/2003; H01L 29/20; H01L 21/02; H01L 21/0242; H01L 21/025; H01L 21/02603; H01L 21/02645
See application file for complete search history.

(56) References Cited

U.S. PATENT DOCUMENTS 7,829,443 B2    11/2010   Seifert et al.
2010/0133509 A1   6/2010   Kawashima et al.
(Continued)

FOREIGN PATENT DOCUMENTS

EP    1 467 404 A2    10/2004
EP    2 544 249 A1    1/2013
FR    1262929    *  12/2012

OTHER PUBLICATIONS

Li et al. ("Polarity and Its Influence on Growth Mechanism during MOVPE Growth of GaN Sub-micrometer Rods," Crystal Growth and Design, ACS, 11, pp. 1573-1577, 2011).*

(Continued)

*Primary Examiner* — Yasser A Abdelaziez
(74) *Attorney, Agent, or Firm* — Howard IP Law Group PC

(57) ABSTRACT

An optoelectric device including microwires or nanowires on a support, each microwire or nanowire including at least one portion mainly containing a III-V compound in contact with the support, wherein the III-V compound is based on a first group-V element and on a second group-III element, wherein a surface of the support includes first areas of a first material promoting the growth of the III-V compound according to the polarity of the first element distributed in a second area of a second material promoting the growth of the compound according to the polarity of the second element, the microwires or nanowires being located on the first areas.

11 Claims, 4 Drawing Sheets

(51) Int. Cl.
- *H01L 29/20* (2006.01)
- *H01L 31/0352* (2006.01)
- *H01L 33/00* (2010.01)
- *H01L 33/18* (2010.01)
- *H01L 31/18* (2006.01)
- *B82Y 40/00* (2011.01)
- *H01L 33/08* (2010.01)
- *H01L 33/24* (2010.01)

(52) U.S. Cl.
CPC ...... *H01L21/0262* (2013.01); *H01L 21/02381* (2013.01); *H01L 21/02387* (2013.01); *H01L 21/02439* (2013.01); *H01L 21/02458* (2013.01); *H01L 21/02603* (2013.01); *H01L 21/02617* (2013.01); *H01L 21/02645* (2013.01); *H01L 29/068* (2013.01); *H01L 29/0673* (2013.01); *H01L 29/20* (2013.01); *H01L 29/2003* (2013.01); *H01L 31/035227* (2013.01); *H01L 31/184* (2013.01); *H01L 31/1852* (2013.01); *H01L 33/007* (2013.01); *H01L 33/18* (2013.01); *B82Y 40/00* (2013.01); *H01L 33/08* (2013.01); *H01L 33/24* (2013.01)

(56) References Cited

U.S. PATENT DOCUMENTS

2012/0205613 A1    8/2012  Mi et al.
2014/0370631 A1*  12/2014  Thompson et al. ............ 438/34

OTHER PUBLICATIONS

Chen et al. ("Homoepitaxial growth of catalyst-free GaN wires on N-polar substrates," Applied Physics Letters 97, pp. 151909-01-151909-03, 2010).*

Chen X. et al., "Homoepitaxial growth of catalyst-free GaN wires on N-polar substrates", Applied Physics Letters, AIP, American Institute of Physics, Melville NY, vol. 97, No. 15, Oct. 13, 2010, pp. 151909-151909.

S.F. Li, et al., "Polarity and Its Influence on Growth Mechanism during MOVPE Growth of GaN Sub-Micrometer Rods.", Grystal Growth and Design, vol. 11, No. 5, May 4, 2011, pp. 1573-1577.

International Search Report for International Application No. PCT/FR2013/052128 dated Nov. 12, 2013.

Preliminary Search Report for French Patent Application FR 158729 dated May 31, 2013.

* cited by examiner

OPTOELECTRIC DEVICE WITH SEMICONDUCTOR MICROWIRES OR NANOWIRES AND METHOD FOR MANUFACTURING THE SAME

CROSS-REFERENCE TO RELATED APPLICATIONS

This is a continuation application of and claims priority to copending International Application Number PCT/FR2013/052128 having an international filing date of Sep. 17, 2013, which in turn claims priority to French Patent Application No. 1258729 filed Sep. 18, 2012, the entirety of each of the foregoing applications being hereby incorporated by reference herein for all purposes.

BACKGROUND

The present disclosure generally relates to semiconductor materials, to devices based on semiconductor materials, and to their manufacturing methods. The present disclosure more specifically relates to semiconductor microwires or nanowires and to devices comprising semiconductor microwires or nanowires.

DISCUSSION OF THE RELATED ART

Microwires or nanowires comprising a semiconductor material generally mainly containing a group-III element and a group-V element (for example, gallium nitride GaN), called III-V compounds hereafter, enable the manufacture of semiconductor devices such as optoelectric devices. Term "optoelectric devices" is used to designate devices capable of converting an electric signal into electromagnetic radiation or conversely, and especially devices dedicated to the detection, the measurement, or the emission of electromagnetic radiation or devices dedicated to photovoltaic applications.

Methods for manufacturing microwires or nanowires comprising a III-V compound must enable to manufacture microwires or nanowires with an accurate and uniform control of the geometry, of the position, and of the crystallographic properties of each microwire or nanowire.

Document U.S. Pat. No. 7,829,443 describes a method for manufacturing nanowires, comprising the deposition of a layer of a dielectric material on a planar surface of a substrate, the etching of openings in the dielectric material layer to expose portions of the substrate, and the forming of nanowires in the openings. The dielectric material is selected so that the nanowires do not tend to directly grow thereon.

A disadvantage of the method described in document U.S. Pat. No. 7,829,443 is that nanowires first develop from the substrate in the openings of the dielectric material layer. The shape of the lateral walls of the openings must therefore be accurately defined, preferably perpendicularly to the substrate surface, to avoid disturbing the growth of nanowires. It may be difficult to form perfectly perpendicular lateral walls at an industrial scale and at low cost.

SUMMARY

Thus, an aspect of an embodiment of the present invention is to at least partly overcome one or more of the previously-described disadvantages of microwire or nanowire optoelectric devices and of their manufacturing methods.

Another aspect of an embodiment of the present invention is for the microwires or nanowires made of III-V compound not to be formed through openings made in a layer of a dielectric material.

Another aspect of an embodiment of the present invention is for microwires or nanowires made of III-V compound to be formed on a substantially planar surface.

Another aspect of an embodiment of the present invention is to accurately and uniformly control the position, the geometry, and the crystallographic properties of each microwire or nanowire made of III-V compound.

Another object of an embodiment of the present invention is to form microwires or nanowires made of III-V compound at an industrial scale and at low cost.

Thus, an embodiment of the present invention provides an optoelectric device comprising microwires or nanowires on a support, each microwire or nanowire comprising at least one portion mainly containing a III-V compound in contact with the support, wherein the III-V compound is based on a first group-V element and on a second group-III element, wherein a surface of the support comprises first areas of a first material promoting the growth of the III-V compound according to the polarity of the first element distributed in a second area of a second material promoting the growth of the compound according to the polarity of the second element, the microwires or nanowires being located on the first areas.

According to an embodiment of the present invention, the periphery of the portion is covered with a layer of a dielectric material from the support up to part of the total height of said portion.

According to an embodiment of the present invention, the dielectric material layer has a thickness ranging between one atomic monolayer and 5 nanometers (nm).

According to an embodiment of the present invention, the first material comprises magnesium nitride or magnesium and gallium nitride.

According to an embodiment of the present invention, the second material comprises aluminum nitride.

According to an embodiment of the present invention, blocks are located on the second area, the blocks comprising said compound and having a thickness ranging between 50 nm and 5 micrometers ($\mu$m) and smaller than the height of the microwires or nanowires.

According to an embodiment of the present invention, the dielectric material layer further covers the blocks.

According to an embodiment of the present invention, the dielectric material comprises the first element and a third element, different from the first and second elements, and each microwire or nanowire further comprises the third element up to said part of the total height only.

According to an embodiment of the present invention, the first areas are separated from one another by the second area and, for each first area, a single microwire or nanowire is in contact with said first area.

According to an embodiment of the present invention, the III-V compound is a III-N compound, selected from the group consisting of gallium nitride, aluminum nitride, indium nitride, gallium and indium nitride, gallium and aluminum nitride, and gallium, aluminum, and indium nitride.

According to an embodiment of the present invention, the dielectric material comprises silicon nitride.

According to an embodiment of the present invention, the total height of said portion of each microwire or nanowire is greater than or equal to 500 nm.

An embodiment of the present invention further provides a method for manufacturing an optoelectric device such as described hereabove, wherein the III-V compound is based on a first group-V element and on a second group-III element, the method comprising the steps of:

(i) forming, on a substrate, first areas of a first material promoting the growth of the III-V compound according to the polarity of the first element and a second area of a second material promoting the growth of the compound according to the polarity of the second element, the first areas being surrounded by the second area; and (ii) forming the microwires or nanowires on the first areas by simultaneously injecting into a reactor the precursors of the first and second elements.

According to an embodiment of the present invention, the method further comprises the forming of a dielectric material layer covering said portion from the support up to part of the height of said portion, the dielectric material further comprising a third element different from the first and second elements, the method comprising, at step (ii), the simultaneous injection into the reactor of the precursors of the first, second, and third elements.

According to an embodiment of the present invention, step (ii) is followed by a step of growth of the microwires or nanowires by injection into the reactor of the precursors of the first and second elements, without injecting the precursor of the third element.

According to an embodiment of the present invention, the method further comprises, at step (ii), the forming of blocks on the second area, the blocks comprising said compound and having a thickness ranging between 50 nm and 5 µm and smaller than the height of the microwires or nanowires.

The foregoing and other features and advantages of the present invention will be discussed in detail in the following non-limiting description of specific embodiments in connection with the accompanying drawings.

DETAILED DESCRIPTION

Figure 1:
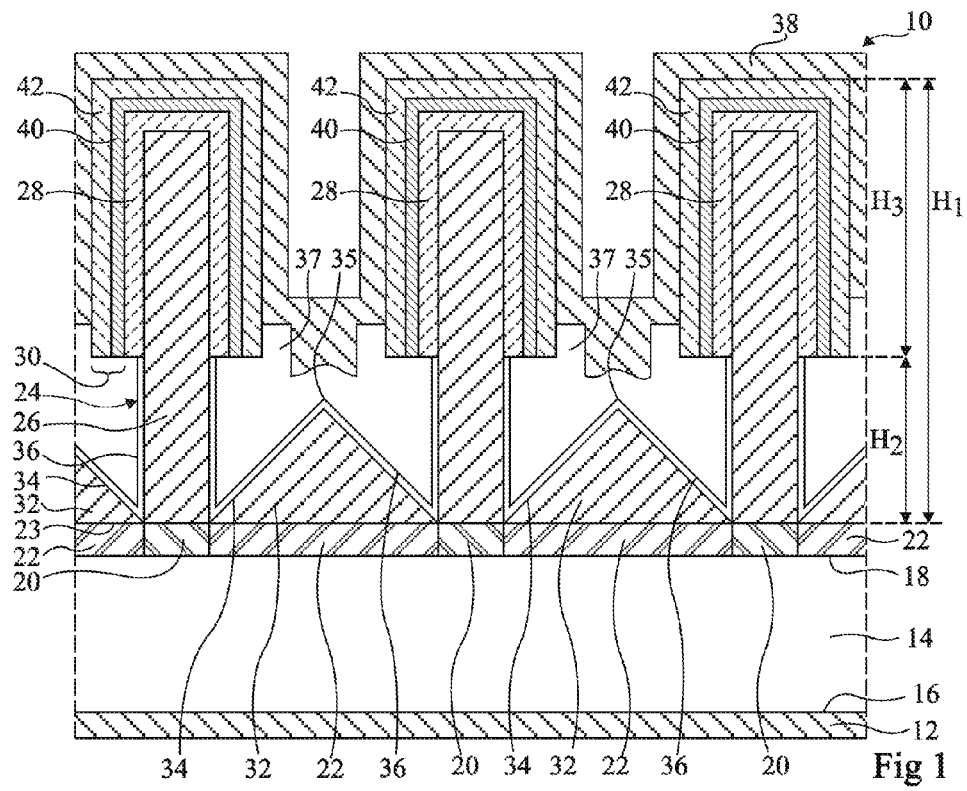
FIG. 1 is a partial simplified cross-section view of an embodiment according to the present invention of an optoelectric device with microwires or nanowires.

For clarity, the same elements have been designated with the same reference numerals in the different drawings and, further, as usual in the representation of electronic circuits, the various drawings are not to scale. Further, only those elements which are useful to the understanding of the present invention have been shown and will be described. In particular, the means for controlling the optoelectric devices described hereinafter are within the abilities of those skilled in the art and are not described.

In the following description, unless otherwise specified, terms "substantially", "approximately", and "on the order of" mean "to within 10%". Further, "compound mainly formed of a material" or "compound based on a material" means that a compound comprises a proportion greater than or equal to 95% of said material, this proportion being preferentially greater than 99%.

The present invention relates to the manufacturing of microwires or nanowires. The term "microwire" or "nanowire" designates a three-dimensional structure of elongated shape having at least two dimensions, called minor dimensions, ranging between 5 nm and 2.5 µm, the third dimension, called major dimension, being at least equal or greater than the largest of the minor dimensions, preferably greater than 5 times the largest of the minor dimensions, and preferably still greater than 10 times the largest of the minor dimensions. In certain embodiments, the minor dimensions may be smaller than or equal to approximately 1,000 nm, and preferably range between 100 nm and 300 nm. In certain embodiments, the height of each microwire or nanowire may be greater than or equal to 500 nm, and preferably ranges between 1 µm and 50 µm.

The cross-section of the microwires or nanowires may have different shapes such as, for example, a shape which may be oval, circular, or polygonal, especially triangular, rectangular, square, or hexagonal. Similarly, the microwires or nanowires may have a cylindrical, conical and/or tapered three-dimensional shape.

The microwires or nanowires may at least partly be formed of semiconductor materials mainly containing a III-V compound, for example, III-N compounds. Examples of group III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

In certain embodiments, the microwires or nanowires may comprise a dopant from the group comprising a group-II P-type dopant, for example, magnesium (Mg), zinc (Zn), cadmium (Cd), or mercury (Hg), a group-IV P-type dopant, for example, carbon (C) or a group-IV N-type dopant comprising silicon (Si), germanium (Ge), selenium (Se), sulfur (S), terbium (Tb), and tin (Sn).

The microwires or nanowires are formed on a surface of a substrate. The substrate is, for example, a semiconductor substrate such as a substrate made of silicon, germanium, silicon carbide, of a material made of a group-III element and of a group-V element, such as GaN or GaAs, or a substrate made of ZnO, sapphire, metal, ceramic, or glass.

An aspect of the present invention is to form, on the substrate where the microwires or nanowires are desired to be grown, a polarity setting surface obtained by areas of a first material surrounded with an area of a second material. According to an embodiment of the present invention, this surface may be substantially planar.

The first material is selected to promote the growth of the III-V compound according to the polarity of the group-V element. The second material is selected to promote the growth of the III-V compound according to the polarity of the group-III element. In certain embodiments of the present invention, the substrate may correspond to the first material or to the second material.

Saying that a III-V compound grows according to the polarity of the group-III element or according to the polarity of the group-V element means that the material grows along a privileged direction and that when the material is cut in a plane perpendicular to the privileged growth direction, the exposed surface essentially comprises atoms of the group-III element in the case of a growth according to the polarity of the group-III element or atoms of the group-V element in the case of a growth according to the polarity of the group-V element.

In the case where the group-V element is nitrogen, the first material may be mainly formed of magnesium nitride in MgxNy form, for example, magnesium nitride in the Mg3N2 form or gallium and magnesium nitride (MgGaN). According to another example, the first material is mainly formed of aluminum nitride (AlN) of nitrogen polarity. It for example is single-crystal aluminum nitride formed at low temperature, for example, at a temperature ranging between 600° C. and 800° C., by epitaxy on a sapphire substrate.

As an example, in the case where the group-III element is gallium, the second material may be mainly formed of aluminum nitride (AlN) of aluminum polarity. One example is single-crystal aluminum nitride formed by epitaxy on a silicon substrate deposited in single-crystal form. According to another example, in the case where the group-III element is gallium, the second material may be mainly formed of gallium nitride of gallium polarity. One example is gallium nitride formed at low temperature, for example, at a temperature ranging between 500° C. and 800° C., by epitaxy on a sapphire substrate. According to another example, in the case where the substrate is nitrided sapphire and the group-III element is gallium, the substrate may be used as the second material.

The method for growing microwires or nanowires may be a method of Metal-Organic Chemical Vapor Deposition (MOCVD) type, also known as Organo-Metallic Vapor Phase Epitaxy (OMVPE). However, methods such as Molecular-Beam Epitaxy (MBE), Gas Source MBE (GSMBE), Metal-Organic MBE (MOMBE), Atomic Layer Epitaxy (ALE), or Hybrid Vapor Phase Epitaxy (HVPE) may be used.

As an example, the method may comprise injecting into a reactor a precursor of the group-III element and a precursor of the group-V element. Examples of group-III element precursors are trimethylgallium (TMG), triethylgallium (TEGa), trimethylindium (TMIn), or trimethylaluminum (TMAl). Examples of group-V element precursors are ammonia (NH3), tertiarybutylphoshine (TBT), or arsine (AsH3).

In the case of microwires or nanowires formed of a III-V compound, the III-V compound grows according to the polarity of the group-V element on the areas of the first material and according to the polarity of the group-III element on the area of the second material.

According to an embodiment of the present invention, in a first phase of growth of the III-V compound microwires or nanowires, a precursor of an additional element is added in excess to the precursors of the III-V compound. The additional element may be silicon (Si). An example of silicon precursor is silane (SiH4).

The present invention is based on the fact that the angle formed, with respect to the substrate surface, by the lateral sides of a crystal of a III-V compound which grows on the substrate according to the polarity of the group-V element is greater than the angle formed, with respect to the substrate surface, by the lateral sides of a crystal of the III-V compound which grows on a substrate according to the polarity of the group-III element. In particular, the angle formed, with respect to the substrate surface, by the lateral sides of a crystal of a III-V compound which grows on the substrate according to the polarity of the group-V element is greater than 85 degrees (85°), and is preferably substantially equal to 90°. In particular the angle formed, with respect to the substrate surface, by the lateral sides of a crystal of a III-V compound which grows on the substrate according to the polarity of the group-III element is smaller than 80°, and is preferably smaller than 70°.

The inventors have shown that the presence of the precursor of the additional element results in incorporating the additional element into the III-V compound, and also in forming a layer of a dielectric material mainly made of the additional element and of the group-V element on the lateral sides of the growing crystals of III-V compound. The concentration of the additional element in the III-V compound ranges between 1018 and 1021 per cubic centimeter (cm-3). The dielectric material layer has a thickness ranging between one atomic monolayer and 5 nm.

For the crystal which grows according to the polarity of the group-III element, the dielectric material layer being formed on the inclined sides prevents any subsequent growth of the III-V compound once the inclined sides have joined at the top. The structures or blocks of said compound obtained on the area of the second material have a thickness ranging between 50 nm and 5 µm, and preferably between 500 nm and 4 µm. This thickness depends on the center-to-center distance between two microwires or nanowires. The height of the microwires or nanowires is preferably greater than the block thickness.

Conversely, for the crystal which grows according to the polarity of the group-V element, the dielectric material layer which forms on the sides substantially perpendicular to the substrate surface does not prevent the upward growth of the III-V compound crystal from continuing. This enables one to obtain a growth of microwires or nanowires on the III-V compound limited to the areas of the first material only.

Advantageously, the structures or blocks obtained between the microwires or nanowires enable an uneven, non-planar surface between the microwires or nanowires. When this surface is covered with a reflective material, this enables to better direct light rays towards the microwires or nanowires or originating from the microwires or nanowires. Examples of reflective materials may be nickel, aluminum, and silver.

FIG. 1 is a partial simplified cross-section view of an embodiment according to the present invention of an optoelectric device 10 which is configured to emit an electromagnetic radiation.

Device 10 comprises, from bottom to top in FIG. 1: a first polarization electrode 12; a semiconductor substrate 14 comprising parallel surfaces 16 and 18, surface 16 being in contact with electrode 12; areas 20 for setting the polarity of the first material separated by areas 22 for setting the polarity of the second material covering surface 18, areas 20 and 22 being juxtaposed and defining a surface 23 opposite to surface 18; microwires or nanowires 24 (three microwires or nanowires being shown) of height H1, each microwire or nanowire 24 being in contact with one of areas 20, each microwire or nanowire 24 comprising a contact portion 26, in contact with area 20, an active portion 28 in contact with contact portion 26, and a polarization portion 30 in contact with active portion 28; structures or blocks 32, in contact with areas 22, comprising inclined sides 34 joining along edges 35; a dielectric layer 36 covering inclined sides 34 of structures 32 and a portion of the periphery of contact portion 26 of each microwire or nanowire 24 from the base of microwire or nanowire 24 in contact with associated area 20; an insulating layer 37 covering blocks 32 and, for each microwire or nanowire 24, a portion of microwire or nanowire 24 from the base of microwire or nanowire 24 in contact with area 20 to cover the edge of polarization portion 30; and a second polarization electrode 38 in contact with each microwire or nanowire 24 at the level of polarization portion 30.

Substrate 14 for example is a semiconductor substrate such as a silicon substrate. Substrate 14 may be doped with a first conductivity type.

Electrode 12 may correspond to a conductive layer which extends on surface 16 of substrate 14. The material forming electrode 12 may for example be nickel silicide (NiSi), aluminum (Al), or titanium (Ti).

Areas 22 for setting the polarity are preferably connected to one another and form a single continuous area. Areas 20 for setting the polarity are preferably separated from one another by an area 22. Each area 20 is totally surrounded with area 22. Areas 20, 22 for example have a thickness ranging between 1 and 100 nm, and preferably ranging between 10 and 30 nm. Each area 20, 22 has a preferential texturing and polarity. The term "preferential texturing" means that the crystals forming areas 20 (respectively areas 22) have a privileged growth direction, which is the same for all areas 20 (respectively areas 22). The term "preferential polarity" means that areas 20 (respectively areas 22) all have substantially the same polarity. This means that when the material forming each area 20 (respectively each area 22) comprises an alloy of at least two elements, when the material is cut in a plane perpendicular to the privileged growth direction of the material, the exposed surface essentially comprises atoms of the same element for each area 20 (respectively for each area 22).

Each area 20 may have the same conductivity type as substrate 14 to limit the interface resistance between area 20, 22 and substrate 14. Each area 20 has a shape corresponding to the cross-section desired for the associated microwire or nanowire 24. As an example, each area 20 has a substantially hexagonal shape with an average diameter selected according to the desired average diameter of the associated microwire or nanowire 24. As a variation, each area 20 may have a rectangular, polygonal, circular, square, or oval shape.

The centers of two adjacent areas 20 may be separated from one another by from 1.5 µm to 5 µm and preferably from 2 to 3 µm. As an example, areas 20 may be regularly distributed on substrate 14, area 22 forming a grid surrounding each area 20. As an example, areas 20 may form a hexagonal network on area 22.

The thickness of each structure 32 measured from underlying area 22 is preferably smaller than or equal to 5 µm, for example between 500 nm and 4 µm. The inclination angle between surface 34 and surface 23 is for example smaller than 80°, preferably smaller than 70°, and in particular substantially equal to 60°.

Each microwire or nanowire 24 is an elongated semiconductor structure in a direction substantially perpendicular to surface 18. Each microwire or nanowire 24 may have an elongated cylindrical general shape with a hexagonal base. The average diameter of each microwire or nanowire 24 may range between 50 nm and 2.5 µm and height H1 of each microwire or nanowire 24 may range between 1 µm and 50 µm.

Contact portion 26 of each microwire or nanowire 24 is mainly formed of the III-N compound, which may have the same conductivity type as substrate 14. The periphery of contact portion 26 is covered with dielectric layer 36 up to a height H2 from the end of contact portion 26 in contact with the associated area 20. Height H2 may range between 500 nm and 25 µm. Dielectric material layer 36 has a thickness ranging between one atomic monolayer and 5 nm.

For each microwire or nanowire 24, active portion 28 corresponds to a layer covering the end of contact portion 26 and extending on the fraction of contact portion 26 which is not covered with layer 36 on the side opposite to area 20 for setting the polarity.

Active portion 28 is at least partially made of a III-N compound, for example, gallium and indium nitride. Active portion 28 may be doped with the first conductivity type, be undoped, or be doped with a second conductivity type opposite to the first conductivity type. Each active portion 28 forms a semiconductor junction with the corresponding contact portion 26. Active portion 28 may comprise confinement means, such as multiple quantum wells.

For each microwire or nanowire 24, polarization portion 30 may comprise a III-N material. Polarization portion 30 may have a conductivity of the second type. Polarization portion 30 may comprise an electron blocking layer 40, with a doping of the second conductivity type, made of gallium and aluminum nitride (AlGaN), in contact with active portion 28, and an additional layer 42, for providing a good electric contact between second electrode 38 and active portion 28, for example, made of gallium nitride (GaN) in contact with electron blocking layer 40 and with electrode 38. The portion of microwire or nanowire 24 comprising the fraction of contact portion 26 which is not covered with layer 36, active portion 28, and polarization portion 30, extends up to a height H3 which may range between 500 nm and 25 µm.

Insulating layer 37 is configured to prevent or mitigate the forming of a direct electric contact between contact portion 26 of each microwire or nanowire 24 and electrode 38. Insulating layer 37 may be made of a dielectric material, for example silicon oxide ($SiO_2$), silicon nitride ($Si_3N_4$), aluminum oxide ($Al_2O_3$), hafnium oxide ($HfO_2$), or diamond.

Second electrode 38 is capable of both polarizing polarization portion 30 of each microwire or nanowire 24 and letting through the electromagnetic radiation emitted by microwires or nanowires 24. The material forming electrode 38 may be a semi-transparent material such as indium-tin oxide (ITO) or aluminum-doped zinc oxide.

FIGS. 2A to 2H illustrate the structures obtained at successive steps of an embodiment of a method for manufacturing optoelectric device 10 of FIG. 1.

Figure 2A:
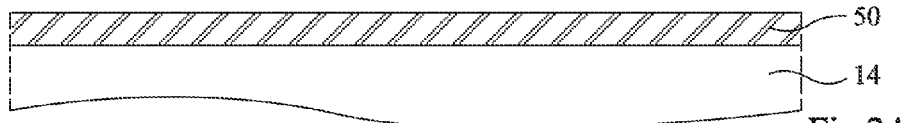
FIGS. 2A, 2B, 2C, 2D, 2E, 2F, 2G and 2H are partial simplified cross-section views of the structures obtained at successive steps of an embodiment according to the present invention of a method for manufacturing the optoelectric device shown in FIG. 1.

An embodiment of the manufacturing method according to the present invention comprises the steps of:

(1) Depositing on substrate 14 a uniform layer 50 of the second material promoting the growth of the III-N compound according to a polarity of the group-III element (FIG. 2A). In one example this is aluminum nitride. Layer 50 for example has a thickness ranging between 1 nm and 2 µm, preferably between 1 and 100 nm. Layer 50 may be obtained by an MOCVD-type method. However, methods such as CVD, MBE, GSMBE, MOMBE, ALE, HVPE or reactive cathode sputtering may be used, as well as any type of deposition enabling to obtain a textured layer. When layer 50 is made of aluminum nitride, layer 50 is substantially textured and has a preferential polarity.

Figure 2B:
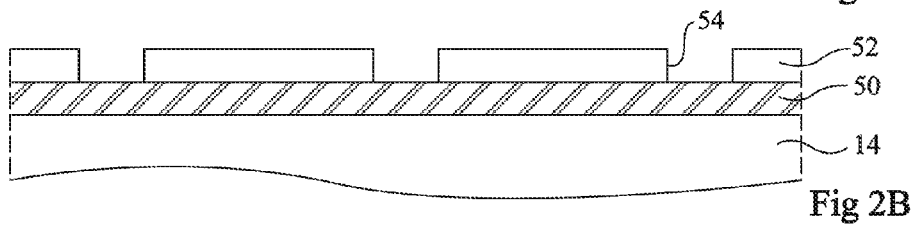

(2) A resin layer 52 is deposited on layer 50 and openings 54 are etched in resin layer 52 to expose portions of layer 50 (FIG. 2B).

Figure 2C:
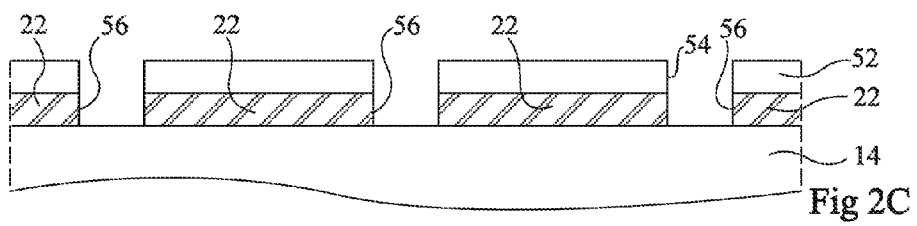
Figure 2D:
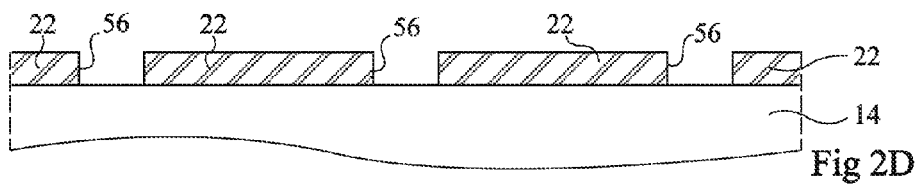
Figure 2E:
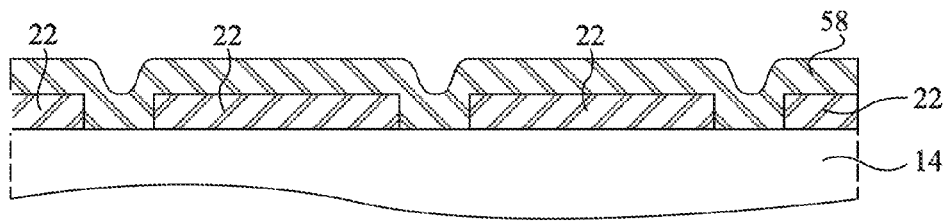
Figure 2F:
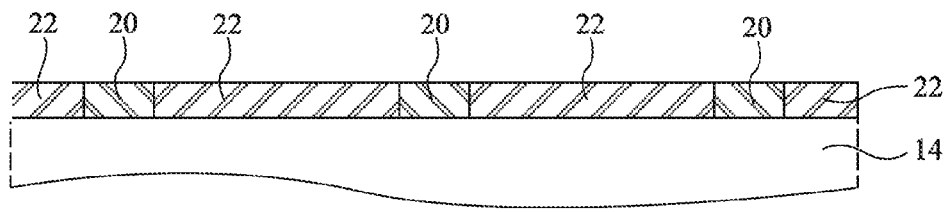

(3) Etching of openings 56 in layer 50 are made to form area 22 (FIG. 2C). Openings 56 substantially have the shape of the cross-section desired for microwires or nanowires 24 to be formed. Openings 56 may be etched by dry etching, for example RIE (Reactive Ion Etching) or ICP (inductively coupled plasma) etching.

(4) Removal of resin layer 52 (FIG. 2D) is performed.

(5) Deposition of a layer 58 of the first material promoting the growth of the III-N compound according to polarity N (FIG. 2E) over the entire structure obtained at the previous step and especially on portions 22 and in openings 56. By way of example said material may be magnesium nitride or magnesium and gallium nitride. The deposition may be obtained by a MOCVD-type method. However, methods such as CVD, MBE, GSMBE, MOMBE, ALE, HVPE, or reactive cathode sputtering may be used.

(6) Etching of layer 58 to reach portions 22 and delimit areas 20 of the first material promoting the growth of the III-N compound according to polarity N (FIG. 2F) in openings 56 of area 22 is performed. This may be a chem.-mech. planarization (CMP) by way of example. The thickness of areas 20 for example ranges between 1 nm and 2 μm, and preferably between 1 and 100 nm.

(7) Growth of a fraction of contact portion 26 of each microwire or nanowire 24 (FIG. 2G) is made up to height H2. The fraction of contact portion 26 of each microwire or nanowire 24 may be obtained by an MOCVD-type method. However, methods such as MBE, GSMBE, MOMBE, ALE, or HVPE may be used. As an example, in the case where contact portion 26 is made of GaN, an MOCVD-type method may be implemented by injection into an MOCVD reactor of a gallium precursor gas, for example, trimethylgallium (TMG) and of a nitrogen precursor gas, for example, ammonia (NH3). As an example, a 3×2", showerhead-type, MOCVD reactor sold by AIXTRON may be used. A molecular flow ratio between trimethylgallium and ammonia within the 5-100 range, preferably within the 10-50 range, promotes the growth of microwires or nanowires. As an example, the gas flows may be approximately 60 sccm (standard cubic centimeters per minute) in TMG and 50 sccm in NH3 and a pressure of approximately 800 mbar (800 hecto-Pascal (hPa)) is used. The gas mixture further comprises the injection into the MOCVD reactor of silane, which is a silicon precursor material. Silane may be diluted in hydrogen at 100 ppm and a molar flow of approximately 400 milliliters (ml) per minute is introduced. The temperature in the reactor for example ranges between 950° C. (Celsius) and 1,100° C., preferably between 990° C. and 1,100° C., preferably still between 1,015° C. and 1,060° C. The pressure in the reactor for example is approximately 800 millibar (mbar) or 800 hecto-Pascal (800 hPa). A carrier gas may be used, for example, nitrogen, for example with a 1,000 sccm flow for TMG and a 1,000 sccm flow for NH3.

The method also results in the growth of structures 32 with inclined sides 34 on area 22.

The presence of silane among the precursor gases causes the incorporation of silicon within the III-N compound. Further, this results in the forming of silicon nitride layer 36, which covers the periphery of contact portion 26 of height H2 of each nanowire 24, except for the top, along the growth of contact portion 26, and which covers inclined sides 34 of each structure 32 along the growth of structures 32. Thereby, when inclined sides 34 join on edge 35 at the top of structure 32, the growth of each structure 32 is stopped.

The inventors have shown that when dielectric layer 36 is not formed, the growth of structure 32 is not stopped and the thickness, measured from area 22, of structure 32, grows as long as precursor gases supply the reactor. Further, the average diameter of microwires or nanowires 24 also tends to grow beyond the average diameter of areas 20.

Figure 2G:
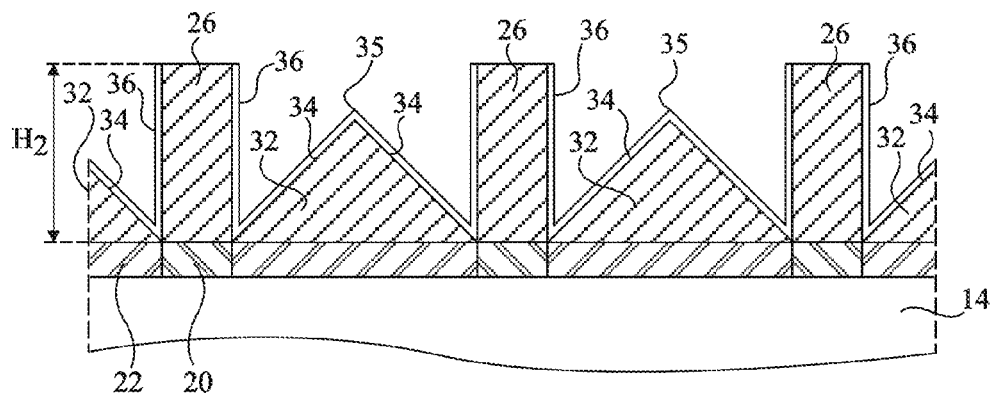
Figure 2H:
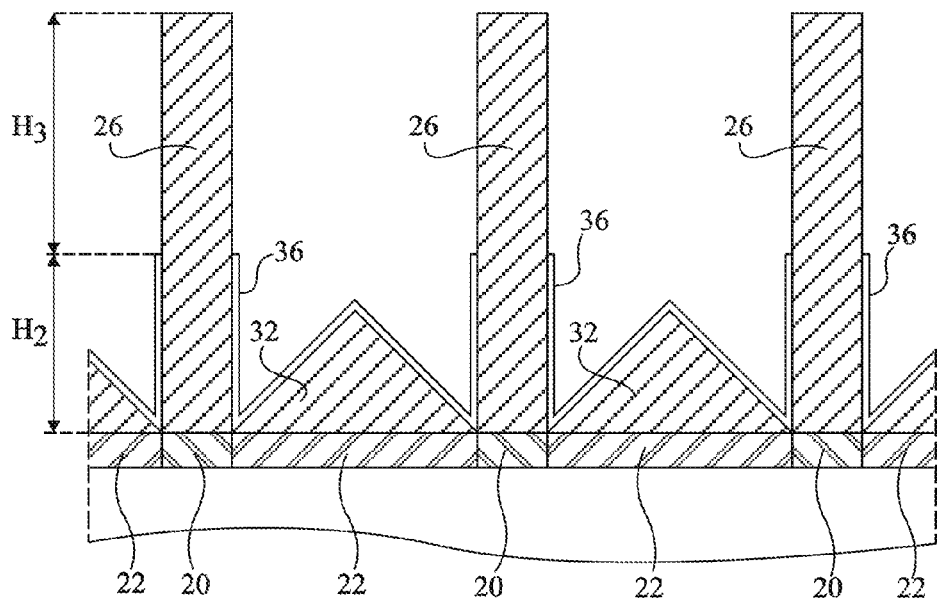

(8) Growth of the remaining fraction of contact portion 26 of each microwire or nanowire 24 up to height H3 (FIG. 2H). As an example, the previously-described operating conditions of the MOCVD are maintained, except that the silane flow in the reactor is decreased, for example by a factor 10, or stopped.

The method comprises additional steps of forming, for each microwire or nanowire 24 of active portion 28, of polarization portion 30, of insulating layer 37, and of electrodes 12, 38. These steps are well known by those skilled in the art and are not detailed further for sake of brevity.

FIGS. 3A to 3F illustrate the structures obtained at successive steps of an embodiment of a method for manufacturing a variation of optoelectric device 10 of FIG. 1.

Figure 3A:
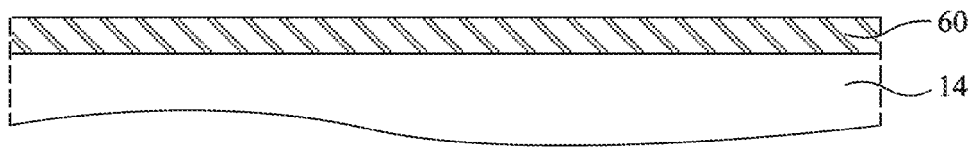
FIGS. 3A, 3B, 3C, 3D, 3E, and 3F are partial simplified cross-section views of the structures obtained at successive steps of another embodiment according to the present invention of a method for manufacturing a variation of the optoelectric device shown in FIG. 1.
Figure 3B:
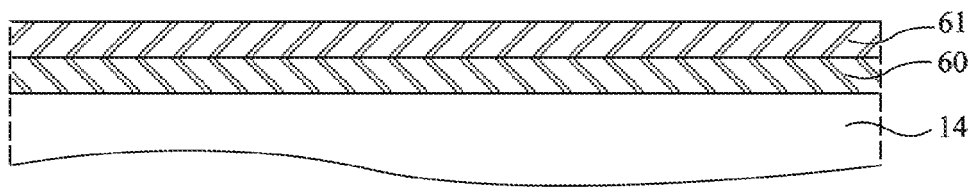

The embodiment of the manufacturing method according to the present invention comprises the steps of:

(1) Depositing on substrate 14 layer 60 of the first material promoting the growth of the III-N compound according to a polarity of element N (FIG. 3A). Said material is, as an example, magnesium nitride or magnesium and gallium nitride. The deposition may be obtained by an MOCVD-type method. However, methods such as CVD, MBE, GSMBE, MOMBE, ALE, HYPE, or reactive cathode sputtering may be used.

(2) Deposition of a layer 61 of the second material promoting the growth of the III-N compound according to polarity III (FIG. 3B) on layer 60.

Figure 3C:
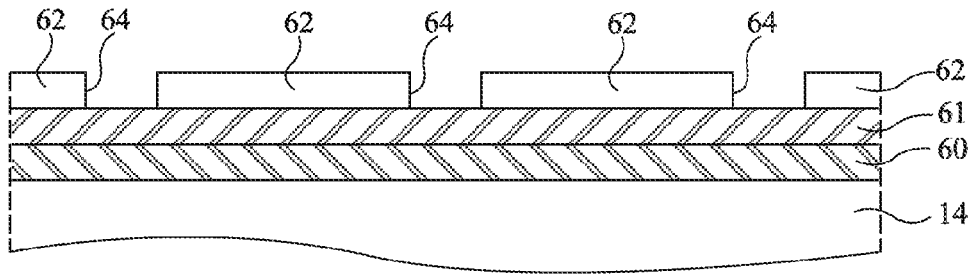
Figure 3D:
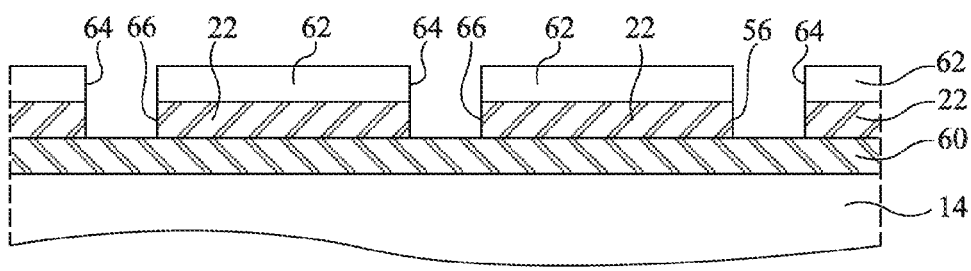

(3) Deposition of a resin layer 62 on layer 61 and etching of openings 64 in resin layer 62 to expose portions of layer 61 (FIG. 3C).

(4) Etching of openings 66 in layer 61 to form area 22 (FIG. 3D) and delimit areas 20 in layer 60. Openings 66 substantially have the shape of the cross-section desired for microwires or nanowires 24 to be formed. Openings 66 may be etched by dry etching, for example RIE (Reactive Ion Etching) or ICP (inductively coupled plasma) etching.

Figure 3E:
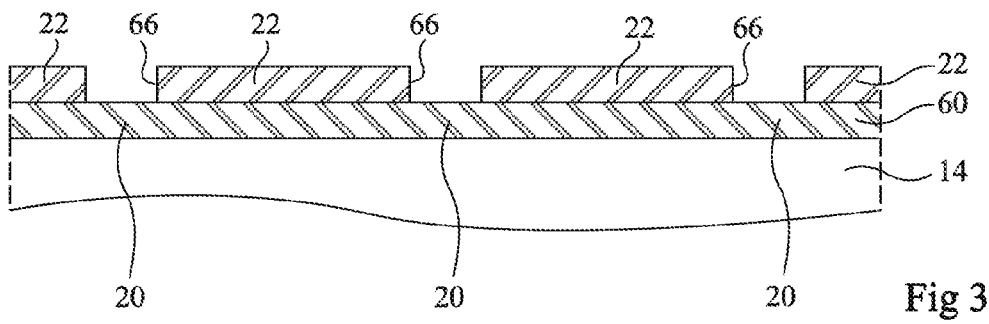
Figure 3F:
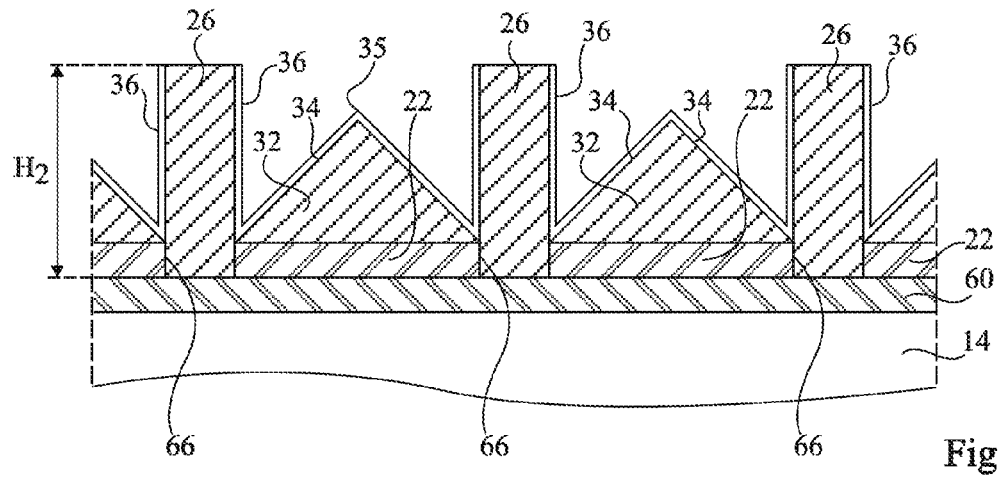

(5) Removal of resin layer 62 (FIG. 3E).

(6) Growth of a fraction of contact portion 26 of each microwire or nanowire 24 (FIG. 3F) up to height H2. Each microwire or nanowire 24 is in contact with layer 60 through one of openings 66.

The fraction of contact portion 26 of each microwire or nanowire 24 may be obtained as previously described in relation with FIG. 2G.

The next steps may be identical to what has been previously described, particularly in relation with FIG. 2H. In the embodiment of the manufacturing method described in relation with FIGS. 3A to 3E, the microwires or nanowires first grow from layer 60 through openings 66 formed in layer 61. However, since layer 61 is made of a material which does not prevent the growth of the III-V compound, the shape of the lateral walls of openings 66 may be defined with less accuracy than for a conventional method where the microwires or nanowires are formed through openings of a dielectric material.

Figure 4:
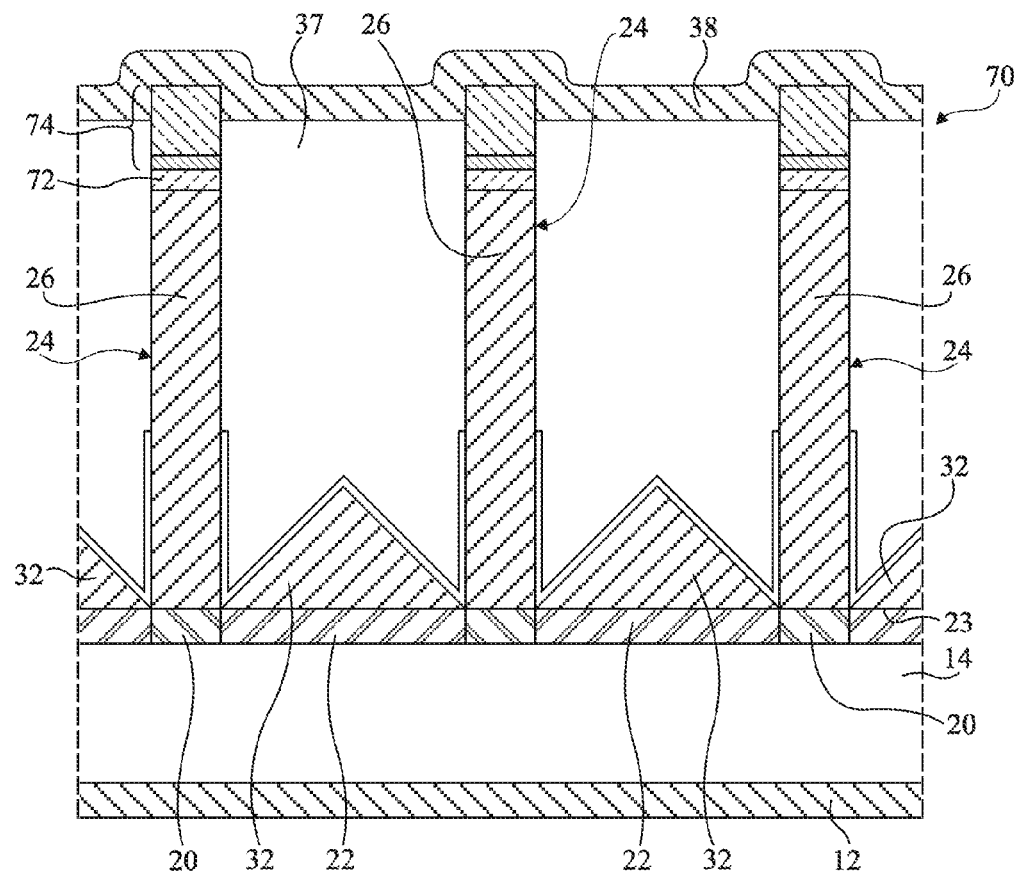
FIG. 4 is a partial simplified cross-section view of another embodiment according to the present invention of an optoelectric device with microwires or nanowires.

FIG. 4 is a partial simplified cross-section view of another embodiment according to the present invention of an optoelectric device 70 which is capable of emitting an electromagnetic radiation. Device 70 differs from device 10 by the shape of the active portion and of the polarization portion of each microwire or nanowire 24. Indeed, for each microwire or nanowire 24, active portion 72 only covers the top of microwire or nanowire 24. Active portion 72 may have the same composition as previously-described active portion 28. Further, polarization portion 74 covers active portion 72. Polarization portion 74 may have the same composition as previously-described polarization portion 30.

Specific embodiments of the present invention have been described. Various alterations, modifications, and improvements will occur to those skilled in the art. In particular, although in the embodiment of the manufacturing method previously described in relation with FIGS. 2A to 2J, area 22 is formed before areas 20, it should be clear that areas 20 may be formed before area 22. Further, while the different previously-described embodiments of optoelectric devices 10 and 70 are capable of emitting an electromagnetic radiation, such devices may easily be adapted by those skilled in the art to receive an electromagnetic radiation and convert it into an electric signal. Such an adaptation is performed both by adapting active portion 28, 72 of each of microwires or nanowires 24 and by applying an adequate polarization to the semiconductor structure.

Such an adaptation of device 10, 70 may be performed to form either an optoelectric device dedicated to measuring or detecting an electromagnetic radiation or an optoelectric device dedicated to photovoltaic applications.

Further, although the previously-described embodiments relate to III-V compounds, the present invention may also be implemented to manufacture II-VI compounds (for example, zinc oxide ZnO) comprising a semiconductor material mainly comprising a group-II element and a group-VI element.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device comprising microwires or nanowires on a support, each microwire or nanowire comprising at least one portion mainly containing a III-V compound in contact with the support, wherein the III-V compound is based on a first group-V element and on a second group-III element, wherein a surface of the support comprises first areas of a first material promoting the growth of the III-V compound according to the polarity of the first element distributed in a second area of a second material promoting the growth of the III-V compound according to the polarity of the second element, the microwires or nanowires being located on the first areas, wherein a periphery of said portion is covered with a layer of a dielectric material from the support up to part of a total height of said portion.

2. The device of claim 1, wherein the dielectric material layer has a thickness ranging between one atomic monolayer and 5 nm.

3. The device of claim 1, wherein the first material comprises magnesium nitride or magnesium and gallium nitride.

4. The device of claim 1, wherein the second material comprises aluminum nitride.

5. The device of claim 1, wherein blocks are located on the second area, the blocks comprising said III-V compound and having a thickness ranging between 50 nm and 5 µm and smaller than the height of the microwires or nanowires.

6. The device of claim 5, wherein the dielectric material layer further covers the blocks.

7. The device of claim 1, wherein the dielectric material comprises the first element and a third element, different from the first and second elements, and wherein each microwire or nanowire further comprises the third element up to said part of the total height only.

8. The device of claim 1, wherein the first areas are separated from one another by the second area and wherein, for each first area, a single microwire or nanowire is in contact with said first area.

9. The device of claim 8, wherein the III-V compound is a III-N compound, selected from the group consisting of gallium nitride, aluminum nitride, indium nitride, gallium and indium nitride, gallium and aluminum nitride, and gallium, aluminum, and indium nitride.

10. The device of claim 9, wherein the dielectric material comprises silicon nitride.

11. The device of claim 1, wherein the total height of said portion of each microwire or nanowire is greater than or equal to 500 nm.

* * * * *